US006952816B2

(12) United States Patent
Gupta et al.

(10) Patent No.: US 6,952,816 B2
(45) Date of Patent: Oct. 4, 2005

(54) METHODS AND APPARATUS FOR DIGITAL CIRCUIT DESIGN GENERATION

(75) Inventors: Shail Aditya Gupta, Sunnyvale, CA (US); Bantwal Ramakrishna Rau, deceased, late of Los Altos, CA (US); by Anita B. Rau, legal representative, Los Altos, CA (US); Mukund Sivaraman, Mountain View, CA (US); Darren C. Conquist, San Francisco, CA (US); Robert S. Schreiber, Palo Alto, CA (US); Michael S. Schlansker, Los Altos, CA (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 23 days.

(21) Appl. No.: 10/266,856

(22) Filed: Oct. 7, 2002

(65) Prior Publication Data

US 2004/0068711 A1 Apr. 8, 2004

(51) Int. Cl.⁷ .............................................. G06F 17/50
(52) U.S. Cl. ................................ 716/18; 716/1; 716/2; 716/3; 716/10; 717/136; 717/141; 717/160
(58) Field of Search ............................. 716/1, 3, 18, 2, 716/8–10; 717/136, 141, 143, 146, 149, 155, 156, 160, 161

(56) References Cited

U.S. PATENT DOCUMENTS

| | | | | |
|---|---|---|---|---|
| 5,801,958 A | * | 9/1998 | Dangelo et al. | 716/18 |
| 5,870,308 A | * | 2/1999 | Dangelo et al. | 716/18 |
| 5,963,730 A | * | 10/1999 | Toyonaga et al. | 716/3 |
| 6,096,092 A | * | 8/2000 | Takahashi et al. | 716/18 |
| 6,216,252 B1 | * | 4/2001 | Dangelo et al. | 716/1 |
| 6,324,678 B1 | * | 11/2001 | Dangelo et al. | 716/18 |
| 6,374,403 B1 | | 4/2002 | Darte et al. | |
| 6,438,747 B1 | | 8/2002 | Schreiber et al. | |
| 6,460,173 B1 | | 10/2002 | Schreiber | |
| 6,463,576 B1 | * | 10/2002 | Tomoda | 716/17 |
| 6,507,947 B1 | | 1/2003 | Schreiber et al. | |
| 6,625,797 B1 | * | 9/2003 | Edwards et al. | 716/18 |
| 6,684,376 B1 | * | 1/2004 | Kerzman et al. | 716/8 |
| 2004/0068331 A1 | | 4/2004 | Cronquist et al. | |
| 2004/0068705 A1 | | 4/2004 | Sivaraman et al. | |
| 2004/0068706 A1 | | 4/2004 | Sivaraman et al. | |
| 2004/0068708 A1 | | 4/2004 | Sivaraman et al. | |
| 2004/0068718 A1 | | 4/2004 | Cronquist et al. | |

OTHER PUBLICATIONS

John C. Gyllenhaal, Wen–mei W. Hwu, B. Ramakrishna Rau, HMDES version 2.0 specification, Technical Report IMPACT–96–3, University of Illinois at Urbana–Champaign, 1996.

Robert Schreiber, Shail Aditya, Scott Mahlke, Vinod Kathail, B. Ramakrishna Rau, Darren Cronquist, Mukund Sivaraman, PICO–NPA: High–Level Synthesis of Nonprogrammable Hardware Accelerators, HP Labs : Tech Report: HPL–2001–249, Hewlett Packard, Palo Alto, CA, Oct. 16, 2001.

(Continued)

Primary Examiner—Vuthe Siek

(57) ABSTRACT

A technique for synthesizing digital circuit designs by incorporating timing convergence and routability considerations. In one aspect, the invention provides a system and programmatic method for generating a circuit design from a functional specification according to at least one design objective. An intermediate representation of the functional specification is formed. The intermediate representation is analyzed for identifying a physical instantiation that will possibly result in unacceptable interconnect delay or congestion. Functional units are allocated from among a plurality of candidate functional units for performing operations of the intermediate representation. Operations are scheduled to occur at specified times on said selected functional units. An architectural representation of the circuit design is formed according to results of scheduling.

56 Claims, 9 Drawing Sheets

OTHER PUBLICATIONS

Leiserson, C.E. and J.B. Saxe, "Retiming Synchronous Circuitry," Systems Research Center of Digital Equipment Corporation in Palo Alto, California (Aug. 20, 1986).

Kirkpatrick, T.I. and N.R. Clark, "PERT as an Aid to Logic Design," IBM Journal of Research and Development, vol. 10 (1995) pp. 135–141.

Devadas, S., et al. "Computation of Floating Mode Delay in Combinational Logic Circuits: Theory and Algorithms," IEEE Transactions on Computer–Aided Design of Integrated Circuits and Systems, vol. 12 (Dec. 1993) pp. 1913–1923.

Charlesworth, A.E. "An Approach to Scientific Array Processing: The Architectural Design of the AP–120B/FPS–164 Family," Computer, vol. 14, No. 9 (Sep. 1981) pp. 18–27.

Rau, B.R. "Iterative Module Scheduling," International Journal of Parallel Programming, vol. 24, No. 1 (1996) pp. 3–64.

"Managing Design Complexity with Behavioral Synthesis," [on–line] [Retrieved on: Sep. 10, 2002] Retrieved from: http://www.synopsis.com/products/beh/syn/beh/syn/br.html (pp. 1–14).

Behavioral Compiler User Guide, Chapter 3, "Optimizing Timing and Area," pp. 3–1 through 3–78, v. 2000.11.

Malik, S. "Analysis of Cyclic Combinational Circuits," IEEE Transactions on Computer–Aided Design of Integrated Circuits and Systems, vol. 13, No. 7 (Jul. 1994) pp. 950–956.

Srinivasan, A. and Sharad Malik, "Practical Analysis of Cyclic Combinational Circuits," IEEE Custom Integrated Circuits Conference (1996) pp. 381–384.

Schlansker et al., "Acceleration of First and Higher Order Recurrences on Processors with Instruction Level Parallelism," Lecture in Computer Science, Proceedings of the 6th International Workshop on Languages and Compilers for Parallel Computing, Hewlett–Packard Laboratories (1993) pp. 406–429.

Rau, B.R., "Data Flow and Dependance Analysis for Instruction Level Parallelism," Lecture Notes in Computer Science, Proceedings of the Fourth International Workshop on Languages and Compilers for Parallel Computing, Hewlett–Packard Laboratories (1991) pp. 236–250.

Kuck et al., "Dependence Graphs and Compiler Optimizations," Annual Symposium on Principles of Programming Languages, Proceedings of the 8th ACM SIGPLAN–SIGACT Symposium on Principles of Programming Languages (1981) pp. 207–218.

Rau, B.R., "Iterative Modulo Scheduling," HP Labs Technical Report HPL–94–115, Compiler and Architecture Research—Hewlett–Packard (Nov. 1995) pp. 1–67.

Robert Schreiber, Shail Aditya, B. Ramakrishna Rau, Vinod Kathail, Scott Mahlke, Santosh Abraham, Greg Snider, High–Level Synthesis of Nonprogrammable Hardware Accelerators, Tech Report: HPL–2000–31, Hewlett–Packard, Palo Alto, CA, May 15, 2000.

* cited by examiner

US 6,952,816 B2

METHODS AND APPARATUS FOR DIGITAL CIRCUIT DESIGN GENERATION

FIELD OF THE INVENTION

The present invention relates to the field of digital circuit synthesis and, more particularly, to improving quality of synthesized digital circuits by incorporating timing convergence and routability considerations.

BACKGROUND OF THE INVENTION

The combination of continuing advances in technology and reduced production costs have led to a proliferation of electronic devices that incorporate or use advanced digital circuits. These electronic devices include desktop computers, laptop computers, hand-held computing devices, such as Personal Digital Assistants (PDAs) and hand-held computers, as well as cellular telephones, printers, digital cameras, facsimile machines, and household and business appliances, among others. The digital circuits included in these electronic devices may be used to provide the basic functionality of the electronic devices or may be used to provide additional, desirable features.

It is desired to produce circuit designs for such devices that are reliable, cost-effective and that provide adequate performance for the application. The cost of a circuit is typically measured in terms of its silicon area and may be estimated from the number of components (functional units, registers, wires, etc.) in the circuit. The performance of the circuit can be expressed as a combination of several metrics, including throughput (the number of tasks executed per clock cycle), latency (the number of clock cycles to complete a single task) and clock speed.

Programmatic techniques have been developed for synthesizing such circuits and their designs. Generally, the process takes a functional specification for the design (e.g., written in a high-level software language, such as C) and produces a hardware circuit with the same functionality as the functional specification.

The functional specification for the design undergoes two design phases: architectural synthesis and physical synthesis. During architectural synthesis, the code is analyzed for dependencies (i.e. where results of an operation are required as input to one or more other operations). Based on the analysis, optimizing transformations are performed on the code (e.g., the operations are reordered) and the operations are mapped to high-level hardware elements and scheduled to occur at specific times. In other words, code from the program is converted into compute devices (such as multipliers and adders) to perform the program's computations, memory devices (such as registers and RAM) to store the program's data, and control devices (such as finite-state machines and micro-controllers) to control execution of the program's instructions. The resulting hardware circuit is typically specified at the register-transfer level (RTL), which is a clock cycle-level structural description of the hardware using high-level hardware elements.

During physical synthesis, the high-level hardware elements are synthesized into low-level hardware elements, such as gates or transistors. The low-level hardware elements are physically arranged and interconnections between the elements are routed. In other words, the RTL specification is mapped onto a physical hardware circuit, such as a field-programmable gate array (FPGA) or other type of target hardware.

Often, it is discovered during the physical synthesis phase that the resulting design does not meet all constraints, such as timing, performance or interconnection routability requirements. When this occurs, a time-consuming manual process is used in which critical paths in the design are discovered and corrected and, then, the circuit is re-synthesized. Correcting all of the critical paths can take several design iterations.

Therefore, what is needed is an improved technique for digital circuit synthesis. What is further needed is such a technique in which timing and routability considerations are taken into account during architecture synthesis so as to reduce the need for manual corrective action during physical synthesis. It is toward these ends that the present invention is directed.

SUMMARY OF THE INVENTION

The invention is a technique for synthesizing digital circuit designs by incorporating timing convergence and routability considerations. Using the techniques described herein, the present invention is able to programmatically synthesize architectural designs that are better suited for subsequent physical synthesis in that they meet design objectives in a first or fewer passes through physical synthesis. In addition, the designs tend to be cost-effective due to improved utilization of clock periods and improved routability of interconnects among hardware elements.

In one aspect, the invention provides a system and programmatic method for generating a circuit design from a functional specification according to at least one design objective. An intermediate representation of the functional specification is formed. The intermediate representation is analyzed for identifying a physical instantiation that will possibly result in unacceptable interconnect delay or congestion. Functional units are allocated from among a plurality of candidate functional units for performing operations of the intermediate representation. Operations are scheduled to occur at specified times on said selected functional units. An architectural representation of the circuit design is formed according to results of scheduling.

DETAILED DESCRIPTION OF A PREFERRED EMBODIMENT

The present invention provides a technique for programmatically generating digital circuit designs that are in accordance with specified objectives, such as timing convergence and routability. Other objectives may include cost, performance, power consumption, etc. The digital circuits can be programmable or non-programmable and may include hardware accelerators. Generally, the process starts with a functional specification for the digital circuit in a high-level software language such as C, Java, Pascal, etc. The functional specification may include nested loops. Accordingly, the detailed description herein describes the invention in the context of nested loops. However, it will be apparent that aspects of the invention are applicable to functional specifications and transformed functional specifications that do not include nested loops.

Using the techniques described herein, the present invention is able to programmatically synthesize architectural designs that are better suited for subsequent physical synthesis in that they meet design objectives in a first or fewer passes through physical synthesis. In addition, the designs tend to be cost-effective due to improved utilization of clock periods and improved routability of interconnects among hardware elements. The invention may operate with different hardware architectures, including, but not limited to, VLIWs, MIMDs, RISCs, custom ASICs, etc., different target implementations, such as FPGAs, standard-cell, custom VLSI, etc., and different process technologies.

The term "programmatic" refers to a process that is performed by a program implemented in software executed on a computer, in hardwired circuits, or a combination of software and hardware. For the invention, programs may be implemented in software that is stored in a memory and/or data storage system for a workstation along with input and output data structures. The programs and data structures may be implemented using standard programming languages, and ported to a variety of computer systems having differing processor and memory architectures. In general, these memory architectures are referred to as computer-readable media.

Figure 1:
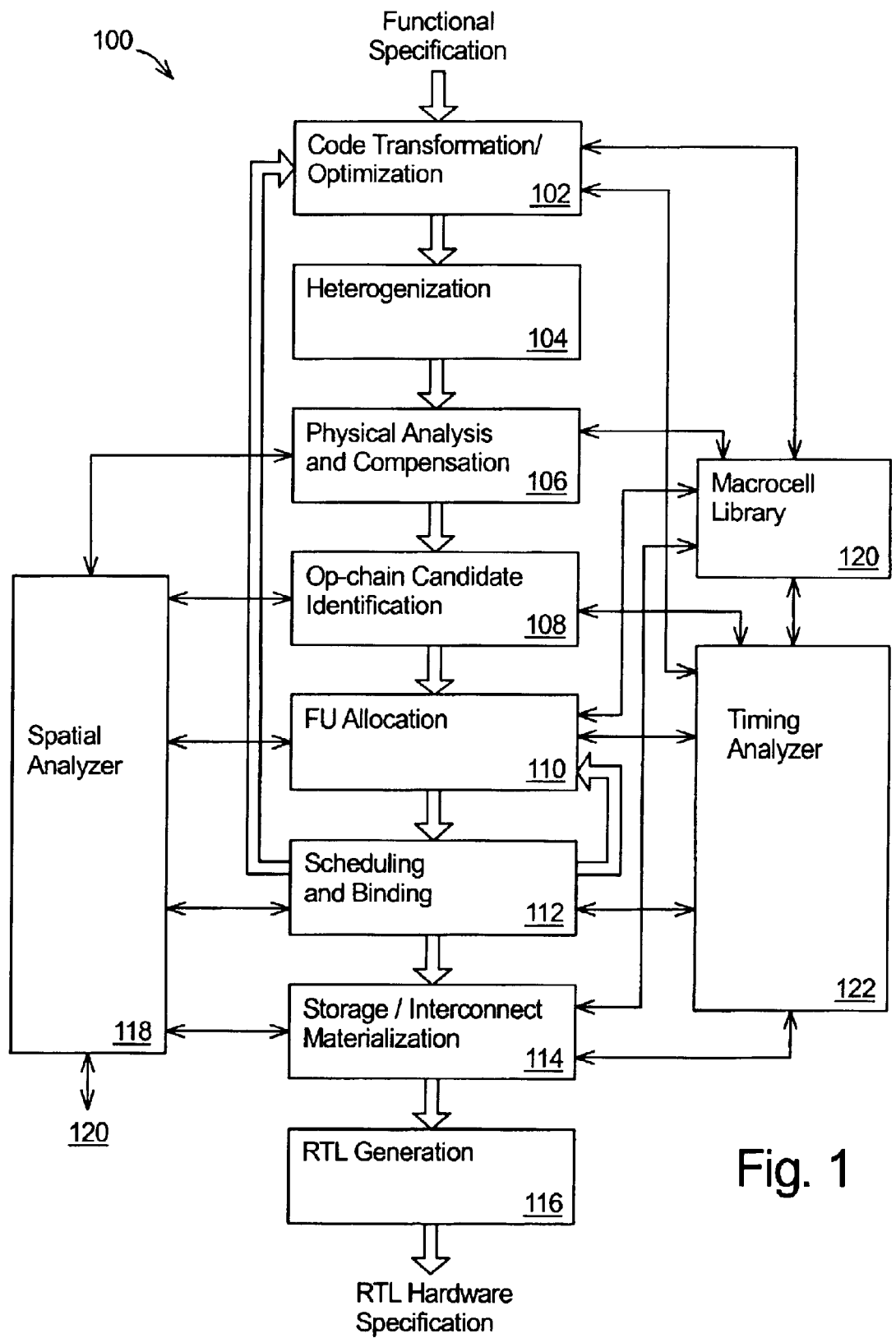
FIG. 1 illustrates a design flow for digital circuit synthesis in accordance with an embodiment of the present invention.

FIG. 1 illustrates a flow diagram illustrating digital circuit synthesis in accordance with an embodiment of the present invention. Design flow is in accordance with steps 102–116, while functional or informational modules 118–122 are called upon during the design flow, as described in more detail herein.

Input to step 102 is a functional specification for the digital circuit. During step 102, code from the functional specification is transformed and optimized according to one or more design objectives such as throughput, cycle time, routability and cost. For example, different organizations of the code in time and/or space may be generated and selected for the design. As another example, the order of operations within the code may be changed and different operations substituted, while maintaining the original functionality of the code. This step may also include conventional compiler operations, such as control flow analysis, data flow analysis, 'dead' code elimination, strength reduction, etc. A result of step 102 is an intermediate code, such as a program graph having nodes corresponding to operations of the functional specification and edges corresponding to dependencies among the operations, though the output could be in the form of another intermediate representation, such as text-based intermediate code.

When the program includes one or more loop nests, loop iteration scheduling may be performed in step 102 in which one or more of the loop nests are transformed such that portions of the loop nest operate in parallel rather than sequentially. A parallel schedule is thus provided that reorders execution times of loop iterations from their original sequential specification so as to execute multiple loop iterations in parallel. Running multiple loop iterations in parallel often requires additional hardware resources, though the code may be optimized in step 102 to achieve a particular performance with minimal hardware by reordering iterations of the loops.

Schemes for loop iteration scheduling that may be used in step 102 are described in: U.S. Pat. No. 6,374,403, entitled, "Programmatic Method for Reducing Cost of Control in Parallel Processes;" U.S. patent application Ser. No. 09/378,393, filed Aug. 20, 1999, and entitled, "Programmatic Iteration Scheduling for Parallel Processors;" and U.S. patent application Ser. No. 10/266,720, filed, Oct. 7, 2002 and entitled, "System and Method for Creating Hardware Solvers," the contents of all of which are hereby incorporated by reference.

Figure 2:
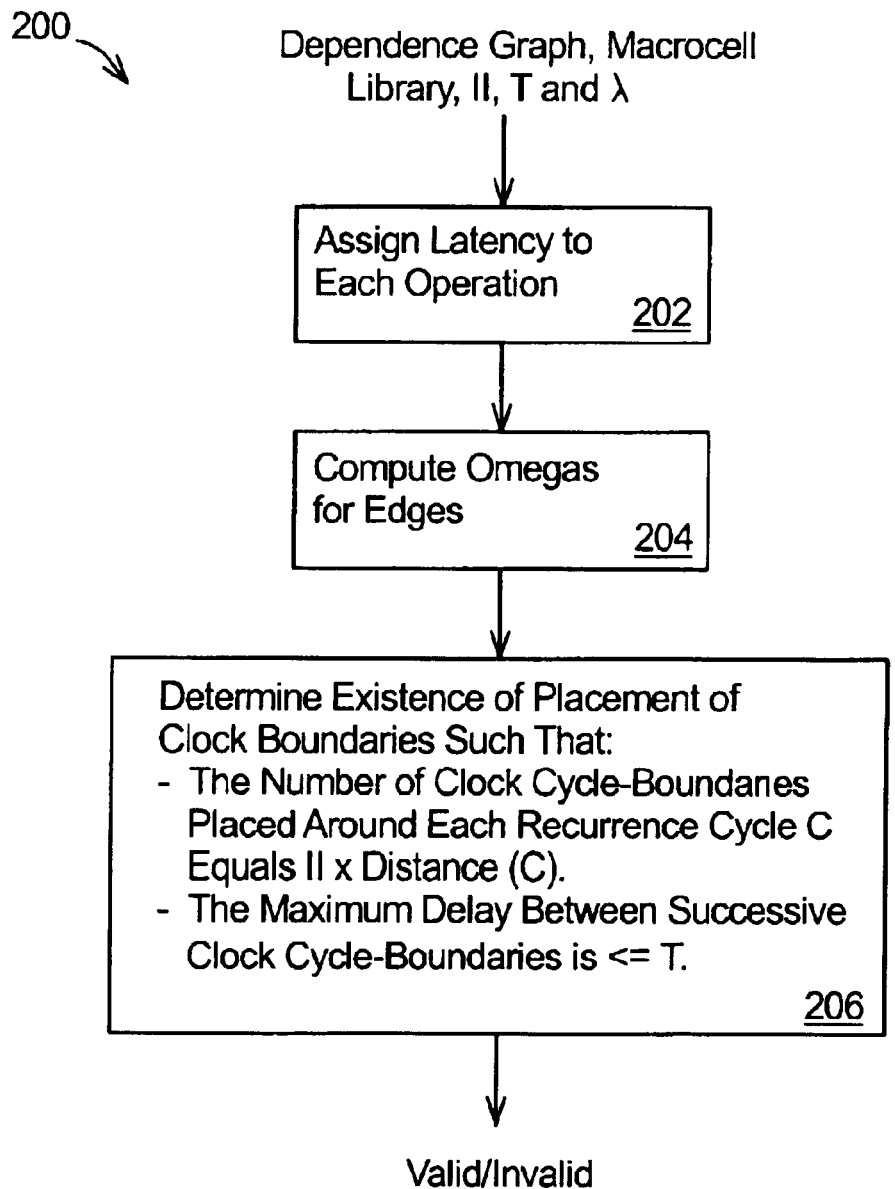
FIG. 2 illustrates a flow diagram for determining validity of a loop iteration schedule in accordance with an embodiment of the present invention.

Given a multi-dimensional loop nest where each iteration is indexed by an iteration index vector i, the start time (in cycles) of the iteration denoted by i is given by $\lambda^T \bullet i$ where the scheduling vector $\lambda$ is a candidate loop iteration schedule generated in step 102 for a specific performance requirement given by an initiation interval II and a clock cycle time T. Furthermore, the initiation interval II is the time elapsed (in cycles) between the start of successive iterations. The present invention extends the prior art in determining a valid loop iteration schedule by performing a validity check on a candidate loop schedule generated in step 102 by the timing analyzer 122. FIG. 2 illustrates a flow diagram 200 for determining the validity of a candidate loop iteration schedule in accordance with an embodiment of the present invention.

Validity of the loop iteration schedule implies that all data dependencies and timing constraints can be satisfied when the loop nest is scheduled according to X and with the candidate II and at the candidate T. A dependence graph corresponding to the original loop nest is received as input in step 202. Typically, the dependence graph will include a number of operations such as additions, multiplications, subtractions, etc. at nodes and edges interconnecting the nodes to signify dependencies among the operations. In addition, the macrocell library 120 (FIG. 1), the initiation interval (II), the clock cycle time (T) and the candidate loop iteration scheduling vector ($\lambda$) are received as inputs.

The macrocell library 120 includes a collection of hardware components specified in a hardware description language. It may include components such as gates, multiplexors (MUXes), registers, etc. It may also include higher-level components such as arithmetic logic units (ALUs), multipliers, register files, instruction sequencers, etc. In addition, the macrocell library 120 may include associated information used for synthesizing hardware components, such as a pointer to synthesizable VHDL/Verilog code corresponding to the component, and information for extracting a machine description (MDES) from the functional unit (FU) components.

In one embodiment, the elements of the macrocell library 120 are specified in the form of Architecture Intermediate Representation (AIR) descriptions. AIR is the internal hardware representation used by one embodiment and it describes the structural interface of the macrocells. During the design process, various synthesis program modules instantiate hardware components from the AIR descriptions in the library. The AIR descriptions and the corresponding information in the functional unit components (called mini-MDES) may be specified in the form of a database language called HMDES Version 2 which is described in the report, "HMDES version 2.0 specification," John C. Gyllenhaal, Wen-mei W. Hwu, B. Ramakrishna Rau, Technical Report IMPACT-96-3, University of Illinois at Urbana-Champaign, 1996.

Thus, each macrocell in the macrocell library 120 conceptually represents the set of hardware implementations that can execute a predetermined set of operations. For example, an adder macrocell may represent a number of representations of hardware implementations for adders that can execute an "add" operation. We associate with each macrocell a set of latency tuples of the form $<\Delta_{in}, pd, \Delta_{out}>$. Each tuple is associated with an operation executing on a hardware implementation of the macrocell, and corresponds to the time taken by the hardware implementation to execute the operation. More specifically, $\Delta_{in}$ refers to the delay between when the input signal arrives and when this signal reaches the first latch in the hardware implementation. The pipeline depth, pd, is the number of latching stages in the hardware implementation. $\Delta_{out}$ refers to the delay between when the signal starts from the final latch in the hardware implementation and when it arrives at the output. $\Delta_{in}$ and $\Delta_{out}$ may be expressed in units of nanoseconds. Pipeline depth is an integer >=0. If it is zero, then the latency tuple can be written compactly as $<\Delta_{thru}>$, which represents the delay of a signal to go from the input to the output of the hardware implementation. As described, the macrocell library 120 may include the tuples associated with the various hardware implementations.

In step 202, a latency is assigned to each operation included in the dependence graph. In a preferred embodiment, each operation in the loop dependence graph is associated with a latency tuple corresponding to a fastest hardware implementation amongst all the macrocells in the library 120 that can execute this operation. We denote this as $<\Delta_{in,op}, pd_{op}, \Delta_{out,op}>$ for operation "op." In one embodiment, we consider a hardware implementation with latency tuple $<\Delta_{in1}, pd_1, \Delta_{out1}>$ to be no slower than another with latency tuple $<\Delta_{in2}, pd_2, \Delta_{out2}>$ if and only if $pd_1 < pd_2$ or, $pd_1 = pd_2$ and $\Delta_{in1} <= \Delta_{in2}$ and $\Delta_{out1} <= \Delta_{out2}$. Note that the set of tuples for a macrocell may only form a partial ordering, not a total ordering. For example, <0.2, 1, 0.6> and <0.4, 1, 0.5> are unordered.

In step 204, the omega for every dependence edge e is computed to be $\lambda^T \bullet d$, where d is the iteration distance vector of e in the given dependence graph. The iteration distance vector d specifies the dependence relation in the multi-dimensional loop iteration space between the operation at the source of the dependence edge e to the operation at the head of that dependence edge. Omega, on the other hand, identifies the actual number of iterations separating the two operations under the loop iteration schedule $\lambda$. Step 206 determines the existence of a placement of clock cycle-boundaries on the operations and edges of the dependence graph such that the following conditions are satisfied: (i) the number of clock cycle-boundaries placed around each recurrence cycle C in the dependence graph equals II×Distance(C), where Distance(C) is the sum of the omegas of the edges in C, and, (ii) the maximum delay between successive clock cycle-boundaries is less than or equal to T.

The condition (i) ensures that the data produced by an operation can be conveyed to its dependent operations at the appropriate time. The condition (ii) ensures that the physical circuit generated due to this recurrence in subsequent step 114 can operate at the desired cycle time objective. If such a placement exists, then step 206 returns a 'valid' output, otherwise it returns an 'invalid' output.

If the output is invalid, this indicates that modifications to the inputs to the method are required. In this case, another possible organization of the code may be tried (e.g., having a different loop iteration schedule, and hence different omegas for the edges) in an attempt to obtain a valid output. When a valid output is obtained, program flow continues.

The method of FIG. 2 may also be used to determine a comparative cost of the iteration schedule proposed by the input candidate scheduling vector ($\lambda$), input initiation interval (II) and input clock cycle-time (T), thereby enabling the determination of valid loop iteration schedules that minimize cost. Here, if step 206 produces a placement of clock cycle-boundaries on the edges of the dependence graph, this placement may be used to estimate the cost of the resulting hardware associated with the proposed iteration schedule. In one embodiment, the cost equals the sum of the number of clock cycle-boundary bits as given by the placement. The number of clock cycle-boundary bits corresponding to the placement of a clock cycle-boundary on a dependency edge equals the bit width of the dependency edge.

The validity checking technique of FIG. 2 is described in more detail in U.S. patent application Ser. No. 10/266,826, filed Oct. 7, 2002, and entitled, "Method of Using Clock Cycle-Time in Determining Loop Schedules During Circuit Design," the contents of which are hereby incorporated by reference.

Note that step 102 may introduce additional recurrences in the intermediate representation that were not present in the input program graph in order to reduce its implementation cost (e.g., through hardware reduction) as described in U.S. Pat. No. 6,374,403, entitled, "Programmatic Method for Reducing Cost of Control in Parallel Processes" incorporated above. The selection of the iteration distance on such recurrences may be made in accordance with the validity constraint so that these recurrences are always valid and incur minimum cost.

Note that step 102 may also employ spatial loop unrolling. This technique is used to unroll one or more nested loop dimensions in order to create an array of hardware solvers. As of yet, no hardware resources have been defined; instead the physical locality is specified as an index to a virtual processor array, where a "virtual processor" is a placeholder for resources to be assigned in subsequent steps of the method 100. In those cases where each of the unrolled iterations may be legally performed in parallel, a dedicated hardware accelerator may be used to perform the calculations for each of the spatially unrolled iterations in parallel. When loop code is unrolled, unrolled iterations are naturally identical. Thus, some or all of these resulting accelerators may be identical that communicate with each other with only regular nearest neighbor interconnections. Such processor array organizations improve routability due to regular geometry and local interconnections. However, different iterations may conditionally require different hardware, therefore spatial unrolling results in potentially unneeded hardware. Also, code that rarely executes can be placed out of loop and, thus, outside the virtual array of processors. Accordingly, unrolled code may result in some accelerators including unneeded hardware.

Thus, in step 104, heterogenization may optionally be performed. In this step, unneeded hardware may be eliminated or reduced. Optimizations such as common sub-expression elimination may be performed that improve cost by eliminating unneeded hardware but may cause some spatial iterations to have simpler code than others. As a result, the virtual processors of the array are no longer entirely homogeneous, but instead, at least some of the virtual processors may be heterogeneous. This removal of unneeded hardware tends to reduce cost of the circuit, since cost is related to the hardware area. The removal of unneeded function units within a virtual processor may simplify the circuit so that timing and routing objectives within a processor may become easier to meet. However, removal of storage elements between virtual processors tends to increase the complexity of routing interconnections among the processors since nearest neighbor interconnect may be transformed into global interconnect when the intervening storage elements are optimized away. Also separate timing analysis may be required for each specialized virtual processor. Schemes for heterogenization are described in U.S. patent application Ser. No. 10/266,720, filed, Oct. 7, 2002, and entitled, "System and Method for Creating Systolic Solvers" incorporated above.

In step 106, physical analysis and compensation are performed. During this step, the intermediate code is analyzed for identifying any instantiations that may result in unacceptable interconnect wire delay and congestion when the wire interconnects are generated (step 114). While all wires can be expect to result in some delay and/or congestion, delay or congestion becomes unacceptable when the tradeoff between doing nothing to alleviate the delay or congestion is outweighed by the benefits of compensation. For example, long interconnect wires are likely to result in unacceptable timing delay in that the delay is likely to cause the circuit to fail to meet a specified clock cycle-time. In response, compensation is inserted into the intermediate code in an attempt to alleviate the delay or congestion. Avoiding wire delay helps achieve timing constraints, while avoiding long interconnect wires improves interconnect routability. Step 106 may optionally include spatial partitioning in which operations of the program graph are spatially partitioned into groups according to timing and routability objectives.

Figure 3:
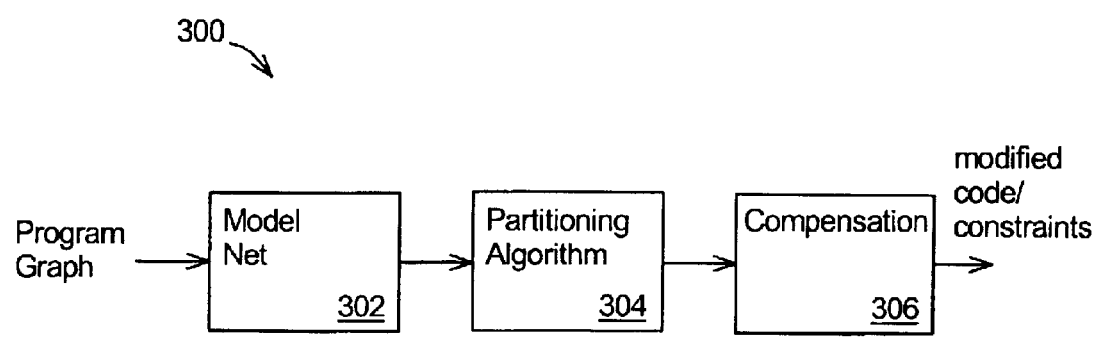
FIG. 3 illustrates a method that may be used in the step for analyzing and inserting compensation into the intermediate program representation for improving routability of physical interconnections in accordance with the present invention.

FIG. 3 illustrates a method that may be used in the step 106 for modifying the transformed and optimized code from step 102 (or step 104) for improving routability of physical interconnections between FUs. A net is a set of connections between an output terminal of a device and input terminals of other devices. Thus, where a variable is defined (DEF) in the intermediate representation and is used elsewhere (USE), the variable data is physically communicated from the location in hardware where it is generated to the other locations where it is used by one or more nets. During physical design, nets with many terminals often cause long wires to be generated and also cause routing congestion (i.e. where many wires are needed in a limited physical space). Thus, it becomes difficult to physically locate the output terminal of a net near to all of its input terminals due to interfering constraints of other nets.

Partitioning is a mechanism for identifying devices that should be placed closer together, in order to lower the number of long wires in the physical circuit. The long wires are not desired because they interfere with the timing of the circuit due to delay caused by signal propagation as well as cause routing congestion.

The transformed and modified code from step 102 (or from 104 if step 104 is performed) may be input to the method 300 in the form of a program graph. The method 300 predicts which dependencies in the code will affect routing delay and/or congestion in the hardware. The method 300 then compensates for these problematic edges by introducing compensation as constraints and/or as modifications of code. One form of compensation has the effect of introducing registers on the problematic connections in order to pipeline the signals. Another form of compensation restricts the sharing of hardware components, such as functional units and registers, in order reduce fan-out and the number of global connections.

The compensation may be provided to the FU allocation step 110 (FIG. 1), scheduling and binding step 112 (FIG. 1), and hardware synthesis steps 114 (FIG. 1) as constraints upon their operations. The compensation may also be provided by modifying the code from its form received from step 102 (or 104).

In step 302, the program graph is modeled as a model netlist for the purposes of making a resulting physical netlist (produced in step 114 of FIG. 1) more amenable to physical design. Note that there is an association between edges of the program graph and nets of the physical netlist (to be used in step 114 of FIG. 1), and there is an association between nodes of the program graph and functional units in the physical netlist (to be used in steps 110 and/or 112 of FIG. 1). However, the association may not be one-to-one because of sharing of FUs and nets by multiple operations and edges respectively.

For purposes of forming the model netlist, each DEF is assumed to be one model net. However, other assumptions may be made. For example, each variable could form a model net by including all DEFs and all USEs of that variable. Thus, the invention assumes that the DEF is an output terminal of a model net, and its USEs are the input terminals. The width of the variable is used to determine the cost of cutting the model net. The variable width may be determined from the data types in the input language, for example, a character in C is eight bits. In addition, the variable width may be further refined by conventional optimization techniques. It is possible that an operation defines only X bits of a variable with Y bits, where X<Y. It is also possible that some of the USEs of this DEF use W<X of the bits. However, because most programs are such that the variable width, DEF width, and USE widths are approximately the same, the method 300 preferably uses the variable width as the cost of cutting model net. Alternative methods are possible, such as gathering the different widths into different sets and creating multiple model nets for DEF depending on how varied the widths are. Another method would be costing the cut as a function of the initiation interval (II), such as width/II. For example, with the preferred cost cutting a model net corresponding to a variable of width one would result in a cost of one, while cutting a model net corresponding to a variable of width sixteen would result in a cost of sixteen.

To create a model netlist from the program graph, a component is created in the model netlist for each node in the program graph. The component selected is preferably the lowest cost functional unit capable of executing the operation. Thus, the method 300 uses the cost (area) of the nodes in the program graph, for example, by using the cost of the smallest macrocell that implements the corresponding operation. Using this cost and spatial analysis techniques discussed below (module 118 of FIG. 1), a partitioning algorithm is applied to the model netlist in order to find the minimum cutset of the model nets, and in turn to find the program graph edges that are best suited for compensation.

The module 118 performs spatial analysis which may be used for determining physical partitioning. A number of different spatial analysis techniques may be implemented, including "Mxp" modeling and floorplanning. The "Mxp" model is an abstract, empirical model of a given physical synthesis design flow that succinctly expresses the conditions under which a successful physical design can be guaranteed or at least under which the physical synthesis is expected to meet specified design objectives. The model determines the probability "p" of successful physical design (e.g., one-pass timing convergence and routing) for a circuit of size "M" with timing slack "x". Note that M is the number of gates in the netlist, and x is the cycle time slack between latch to latch paths. Further note that this slack is the amount of time within a clock period that can be slack (or is left for wire delay). Thus, the model may provide a partition size M based on a given timing slack x or may provide a timing slack x given a partition size M. In the case where the model provides the timing slack x, the slack x may then be used as input for subsequent steps of the method 100 (e.g., in the allocating step 110 and/or the scheduling step 112). The model may be calibrated with respect to a given design flow consisting of standard physical synthesis and circuit layout tools by experimentally running several test circuits of various sizes through it and measuring the amount of average slack at various design points. The ratio of circuits that successfully pass the physical design flow to the total number of circuits tried at that size (M) and slack (x) gives the probability of success (p). A family of curves between any two out of three variables may be generated to give rise to a "Mxp" model. This empirical calibration methodology also extends to other physical synthesis metrics such as power, number of pins etc. and may be used to estimate such physical synthesis metrics during architectural synthesis.

Floorplanning refers to a more detailed analysis of the circuit layout potentially involving block placement and global wire routing. Thus, rather than treating the size only in terms of number of gates, floorplanning analysis is based on geometric layout albeit at a high level of abstraction. Floorplanning gives a more detailed estimate of the routing congestion and the necessary slack in order to meet timing.

The notion of cost is useful during partitioning because the partitions should be limited in size and be balanced. Without size limit on the partitions, successful timing convergence and routing within the partition cannot be guaranteed. Without balance, the minimum cut would be zero and all nodes would be in one partition (and hence make that partition too big) and no nodes in the other partition; since no net crosses the partition, the cutsize is zero. The method 300 preferably is given a weight that relates closely to the component's area. In a pessimistic view, no sharing ever occurs, and the component weight is just the component area. In an optimistic view, complete sharing occurs, and the component weight is the component area divided by II. A view in between pessimistic and optimistic may be used. The preferred view of the method 300 is to be optimistic where the component weight is the component area divided by II, but to add a correction factor for expensive operations before and/or during partitioning to help ensure that this optimism is correct. The cost of a node in the model netlist is sum of the costs of the node's operations. Note that the simulated functional unit allocation may be different from the actual functional unit allocation, which is performed later (in step 110 of FIG. 1).

The method 300 then optionally executes a partitioning algorithm 304 on the model netlist to find the minimum cuts. First, the algorithm 304 preferably determines the number of partitions N to make for the given program graph according to given design objectives. In one embodiment, a desired slack x may be provided as a fixed fraction of the cycle time T from which the required partition size M may be determined for a desired probability of success p using the spatial analyzer 118. Alternatively, a fixed partition size M may be desired for which the necessary timing slack x may be computed by the spatial analyzer 118. The method 300 may then perform topological partitioning or geometrical partitioning. For topological partitioning, the invention then preferably uses recursive bi-partitioning to obtain N partitions. Standard algorithms exist to perform bi-partitioning, e.g. KLFM (Kernigham, Lin, Fiduccia, Mattheyses).

For geometric partitioning, partitions may be formed by standard floorplanning techniques (by spatial analyzer module 118 of FIG. 1). First, the N partitions are organized geometrically. For example, the method 300 may assume that nine partitions form a 3×3 2-d partition array, where p00 is the upper left partition and p22 is the bottom right partition. The quality of the partitioning may then be based not just on the cutsize of the partitions, but also on the distance that the nets span within the partition array. For example, simulated annealing algorithms evaluate the partition in terms of the semi-perimeter of each net, which is equal to one-half the perimeter of the bounding box of all terminals covered by the net within the partition array. Then, the method 300 may insert different types of compensation for nets that span neighboring partitions (such as p00 and p01) and nets that span far away partitions (such as p00 and p22).

Both techniques assign components to partitions, while minimizing the number of cut nets and/or the geometric distance covered by the nets. After completion of partitioning, the method 300 returns assignment of nodes to partitions.

During partitioning, the method 300 moves nodes between different partitions to attempt to minimize the number of cut nets and/or the geometric distance covered by the nets. Each node in the model netlist contains multiple operations from the program graph. The model netlist node is the smallest unit that can be moved between partitions. The method 300 associates particular operations with each other in a node, so that they are maintained in the same partition, and/or are swapped together as group.

The method 300 may place more than one operation in a node based on several factors. One is for minimizing the cost of expensive operations. As mentioned, the method 300 may cost expensive operations optimistically as the component area divided by II. However, if the expensive operations of some type are all in different partitions, the real cost per operation is the component area. One way to minimize the cost is to merge expensive operations of the same type into the same node, in multiples of II. Thus, each final partition will then better utilize the expensive FU. For example, if II=2, and the program has two divide operations that can share one functional unit (divide operations are expensive in terms of area and complexity to build as logical units), then these two operations may be placed in the same node. Thus, in the FU allocation step 110, only one divider FU will need to be assigned for the two operations. Note that the actual FU allocation ensures that FUs are not shared across partitions. Thus, operations that might otherwise have shared the same functional unit that are in different partitions are assigned separate functional units. This method 300 preferably does not merge less expensive operations into the same node, even though this might prevent sharing in some cases. Since the operations are cheap, the additional area in the physical netlist would be small, and the benefit is that the resulting netlist may be more amenable to physical design. A cost threshold may be set for determining whether an FU should be shared. In one aspect, the components may be assigned to the partitions such the partition weights (the sum of all component weights in a partition) are balanced between the partitions, such that the partitions are approximately weight balanced (e.g., within approximately 10%).

The method 300 may use the information derived from the partitioning to insert compensation in one or both of two ways. The method 300 may modify the code from step 102 and/or the method 300 may constrain the operations of the back end, namely the FU allocation step 110, the scheduling and binding step 112, and/or the hardware synthesizing step 114. Such constraints may be conveyed either directly or through the spatial analyzer as shown in FIG. 1.

The method 300 preferably introduces one or both of two forms of compensation to deal with routing delay and/or congestion. A first type ("type 1") has the effect of introducing registers on the inter-partition connections in order to pipeline the signals which increases the likelihood of meeting timing objectives. A second type of compensation ("type 2") restricts the sharing of hardware components, such as functional units and registers, in order to reduce fan-out, congestion and the number of global connections.

The method 300 preferably introduces type 1 compensation so that each cut net in the model netlist will become at least two nets in the physical netlist. The method 300 may modify the program graph, or, the constraint specification (the constraint specification that is to be provided as an output of the method 300) based on the partitioning. The method 300 preferably reduces the effects of cut nets by adding delay or placing registers on the cut nets, between the connections that were cut. Thus, the problematic program graph edges become pipelined in the physical netlist. For example, one or more explicit move operations may be inserted into the program graph or into the constraint specification. Note that this assumes that a move would require at least one cycle of operation and would add at least one register to the modified netlist. Thus, the insertion of moves adds delay to the modeled netlist and the resulting actual netlist.

Alternative methods for providing type 1 compensation exist. For example, type 1 compensation could take the form of scheduling constraints on the scheduling and binding step 112. It could require that the scheduler increase the earliest start time of operations which use a value that was produced in a different partition. The amount of the increase would correspond to the desired inter-partition delay. The constraints may also indicate that storage and interconnect materialization step 114 must insert the required delay on cut connections, as determined from the partitioning of the model netlist.

Because type 1 compensation adds registers along problematic connections, timing convergence is made easier during physical design, and the circuit may not require additional buffers and/or registers to be inserted into the wires during physical design. Note that because the compensation is inserted prior to scheduling, the invention may result in a different netlist than applying pipelining and retiming to an existing netlist. The resulting netlist from the invention may have a different functional unit mix and operation binding than a netlist having pipelining and retiming applied to the netlist created without type 1 compensation.

The constraints on the FU allocation step 110, the scheduling and binding step 112, and/or the hardware synthesizing step 114 may indicate that the FUs allocated operate on each partition, independent of the other partitions. This prevents sharing of resources across the partitions, and prevents the formation of some long wires between partitions. This may cause additional functional units to be assigned to the circuit, but tends to reduce the number of long wires created during physical design. The constraints may also indicate that the scheduling and binding step 112 may only time-multiplex operations from the same partition onto the same functional unit. The constraints may also indicate that hardware synthesizing step 114 must insert the required delay on cut connections, as determined from the partitioning of the model netlist.

Thus, type 2 compensation reduces wire delay and congestion by restricting the sharing of resources in order to make the resulting hardware solver's communication less centralized and more distributed. Centralized communication results in more wires constrained within a small area thereby resulting in routing congestion. It also results in more wire delay due to a large number of consumers on the same net. In the preferred method, type 2 compensation takes the form of constraints. The constraints cause FU allocation to be performed for each partition independent from FU allocation for the other partitions. During scheduling, the alternative lists for each operation are restricted to the functional unit within the operation's partition. This prevents two operations that are deemed to be far apart in the model netlist (e.g. they are in different partitions) from sharing the same functional unit hardware in the physical netlist. Another approach for type 2 compensation is to add constraints that prevent storage materialization (step 114) from allowing variables in different partitions from sharing the same storage structures.

The result of the method 300 is a netlist that is more amenable to physical design. In particular, the netlist leads to fewer long wires and/or less routing congestion during physical design thereby improving routability in comparison to existing techniques. By reducing long wires, timing constraints tend to be easier to meet since longer wires increase signal propagation delays. Depending on the circumstances, cost may be increased due to lack of sharing of FU's across partitions.

The partitioning technique of FIG. 3 is described in more detail in U.S. patent application Ser. No. 10/266,719, filed, Oct. 7, 2002, and entitled, "System and Method for Reducing Wire Delay or Congestion During Synthesis of Hardware Solvers," the contents of which are hereby incorporated by reference.

After the partitioning, as described above, an op-chain candidate identification step 108 may optionally be performed. The purpose of this step is to reduce the cost of the physical circuit to be generated in step 114 by identifying a more efficient placement of clock cycle boundaries along both cyclic and acyclic paths within the program graph. For this, potential operator chains in the program graph are identified using a pattern matching engine. The pattern matching engine uses a library of templates which may be specified in a general template specification language and matches the templates with the operators and operands in the program graph. Note that op-chain candidate identification can alternately be performed after the FU allocation step 110. In this case, FUs available for op-chaining may be limited to those actually allocated rather than to the entire macrocell library 120.

Figure 4A:
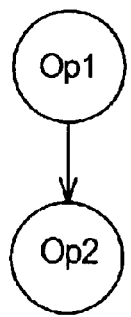
FIGS. 4A–C illustrates exemplary op-chain templates for use in op-chain candidate identification in accordance with an aspect of the present invention.
Figure 4B:
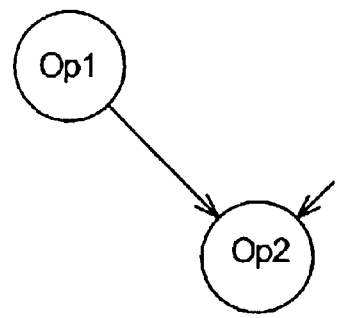
Figure 4C:
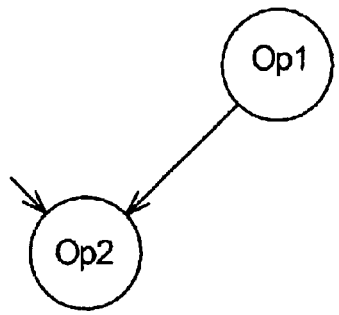

FIGS. 4A–C illustrates exemplary op-chain templates for use in op-chain candidate identification, in which "Op1"

may be an arithmetic, logical, comparison or move operation that feeds into a unary or non-unary operation "Op2." The templates may be used to exclude certain operations from being chained due to system interface constraints. For example, loads/stores may be excluded if the path from/to external memory doesn't have enough timing slack. Note that these templates only specify potential operator chains of length equal to two. Longer chains of operations may be formed by the concatenation of back-to-back operator chains (e.g., during the scheduling and binding step 112). Therefore, these templates are sufficient for identifying all chaining opportunities including those across loop iterations.

For each pattern match that is identified by the pattern matcher, a program-level timing analysis is performed as follows in order to check if the pattern is indeed chainable. For the pattern under consideration, each operator in the pattern may be mapped to its fastest hardware implementation (i.e. the one with the maximum available slack) from among the macrocells available in the macrocell library 120 of FIG. 1. Then, the delay of every latch-to-latch signal path induced by chaining the operations in the pattern is computed using the components chosen and checked against the specified cycle-time T. An exemplary mapping from an operator chaining pattern to corresponding hardware is illustrated in FIG. 5.

Figure 5:
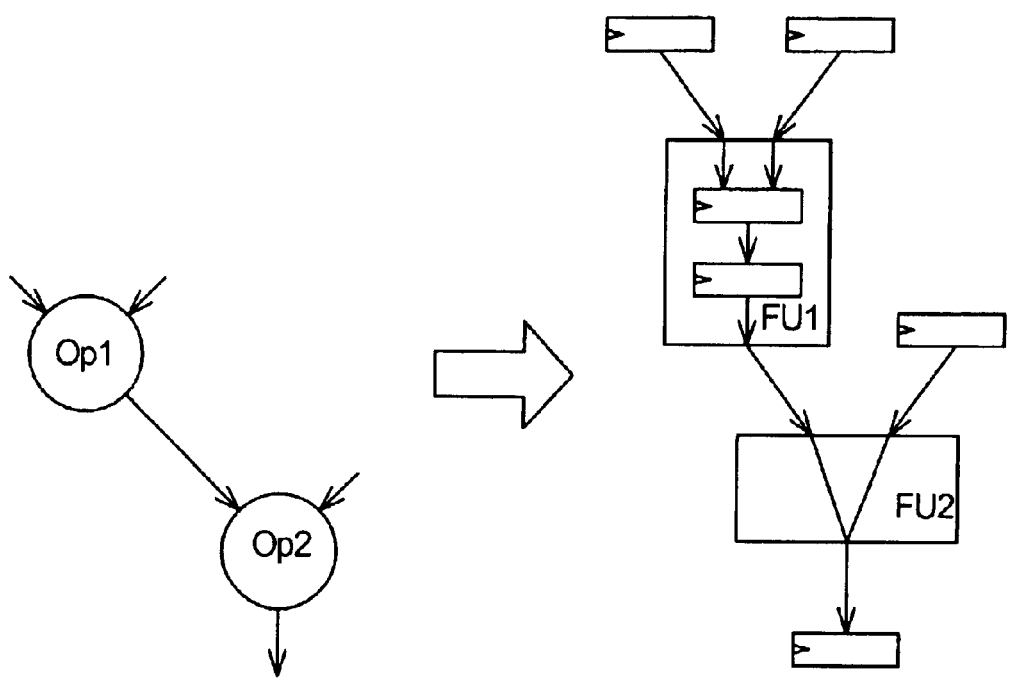
FIG. 5 illustrates an exemplary mapping from an operator chaining pattern to corresponding hardware in accordance with an aspect of the present invention.

As shown in FIG. 5, Op1 is mapped to FU1, which happens to be internally pipelined, while Op2 is mapped to FU2 which is combinational. The signals going into and out of the pair of FUs are terminated in latches and the resulting hardware structure is checked for timing validity by timing analyzer 122. This timing check may be performed during scheduling and binding step 112 and storage and interconnect materialization step 114, described herein.

Choosing the fastest hardware mapping results in an optimistic timing check, therefore, any pattern that fails to satisfy timing at this point will certainly not meet timing when the corresponding operations get scheduled and bound to actual FUs during scheduling and binding step 112. Such timing-violating patterns are filtered out, thereby reducing the total number of potential chains that need to be considered during the scheduling and binding step 112.

For those patterns that pass the timing check, a chaining attribute may be annotated on the program graphs internal representation. These attributes are kept up to date as further compiler optimizations take place and are used in scheduling and binding (step 112), as explained herein.

The op-chaining step 108 may be omitted. By omitting this step, less timing analysis is required to determine whether particular operations can be chained. However, op-chaining tends to reduce cost of the circuit since chaining operations allows registers that would otherwise be present between the operations to be omitted. Since cost is related to component area, fewer registers will generally result in lower cost.

In FU allocation step 110, FUs from the macrocell library 120 are allocated to operations to be performed by the digital circuit. In one aspect, operations may be grouped into clusters based on their width and a least-cost set of FU's are allocated for each width cluster using a mixed integer-linear program (MILP) formulation. In the course of formulating this MILP problem, we determine whether a given FU can execute a given operation type. In addition, the present invention ensures that the delay of the FU when executing the widest operation of a given type in the given width cluster satisfies the specified clock cycle-time T. For example, a 32-bit multiply operation executing on a 32-bit pipelined multiplier FU may meet the specified cycle-time, but may not do so on a 32-bit combinational multiplier FU. Therefore, the combinational multiplier would be excluded from consideration for this multiply operation during FU allocation. In one embodiment, for combinational FUs, $\Delta_{thru}$ for the specified width and typical driving load is checked to be less than T; for pipelined FUs, each of $\Delta_{in}$, $\Delta_{pipe}$, $\Delta_{out}$, for the specified width and typical driving load are checked to be less than T. Here, $\Delta_{pipe}$ is the time delay between the pipeline stages of the FU.

Thus, the FU allocation step 110 is preferably performed so as to reduce cost of the circuit by selecting FU's that can perform the necessary functions, while also meeting timing constraints. In addition, FU allocation step 110 may be performed to minimize power consumption by selecting FUs according to their expected power requirements.

FU allocation is described in more detail in U.S. patent application Ser. No. 09/378,431, filed Aug. 20, 1999, and entitled, "Function Unit Allocation in Processor Design," the contents of which are hereby incorporated by reference.

Dependence edges may be drawn for the program graph prior to the scheduling and binding step 112. At this point, the flow-edge latencies between potentially chainable operations are reduced by one cycle. For instance, if a three-cycle multiply operation can be chained with an add operation, the flow-edge latency from the multiply operation is indicated as two-cycles rather than three cycles. This takes into account that chained operations do not need to wait until the next cycle to be performed. Also potential operator chaining information is allowed to be conveyed for use in the scheduling and binding step 112, which may operate using integer latencies.

In step 112, scheduling of operations to occur and binding of the operations to FUs is performed. Based on the timing information (e.g., operator chaining information and the timing slack information), the scheduler makes scheduling and binding decisions that are correct with respect to timing, i.e. they do not lead to violation of the cycle-time T. It also honors partitioning constraints, if any, generated at step 106 that are necessary in order to keep the wire routing congestion and delay within acceptable limits. The scheduler preferably selects operations according to priority by picking up a highest priority operation and attempts to schedule the operation at a time slot at which an FU capable of performing the operation is available. The priorities may be assigned according to their positions in the dependence graph.

The combination of a specific time slot and a specific FU resource is referred to as a scheduling pattern. Timing slacks may be actively managed during this phase by checking the timing validity of each scheduling pattern considered for an operation. This involves the timing analyzer 122 ensuring that selecting this pattern will result in hardware in which every data flow path satisfies the given cycle-time constraint. In addition, timing slack assumptions made during physical analysis 106 regarding wire lengths will affect the ability to schedule the operations while still meeting cycle-time constraints.

The validation of a scheduling pattern depends on previous scheduling and binding decisions because they determine the physical connectivity among the hardware FU components. Accordingly, an architectural modeler may be used (e.g., in the timing analyzer 122) that maintains an internal representation of the partial hardware structure as it is being defined during the scheduling process. The architecture modeling can be fine-grained, in which data flow between FUs is bound to registers and the corresponding interconnect is synthesized, or can be coarse-grained, in which data flows are modeled as virtual links between producing and consuming FUs. It is believed that the coarse-grained architecture modeling is sufficiently accurate for this timing analysis purpose.

In order to perform the timing validation, the architecture modeler temporarily updates the hardware structure with the scheduling pattern under consideration. Architecture-level timing analysis is then performed, as described below, to check is this resulting hardware structure can be clocked at the specified cycle-time. If the scheduling pattern fails the timing validity check, then it is removed from consideration at this scheduling step.

Both the hardware structure updating and timing analysis may be performed repeatedly for different scheduling patterns. As such, they are preferably efficient in terms of time to execute. In addition, the structure updating and timing analysis are preferably performed incrementally, such that timing analysis is performed only for portions of the updated hardware structure whose timing is affected.

Figure 6:
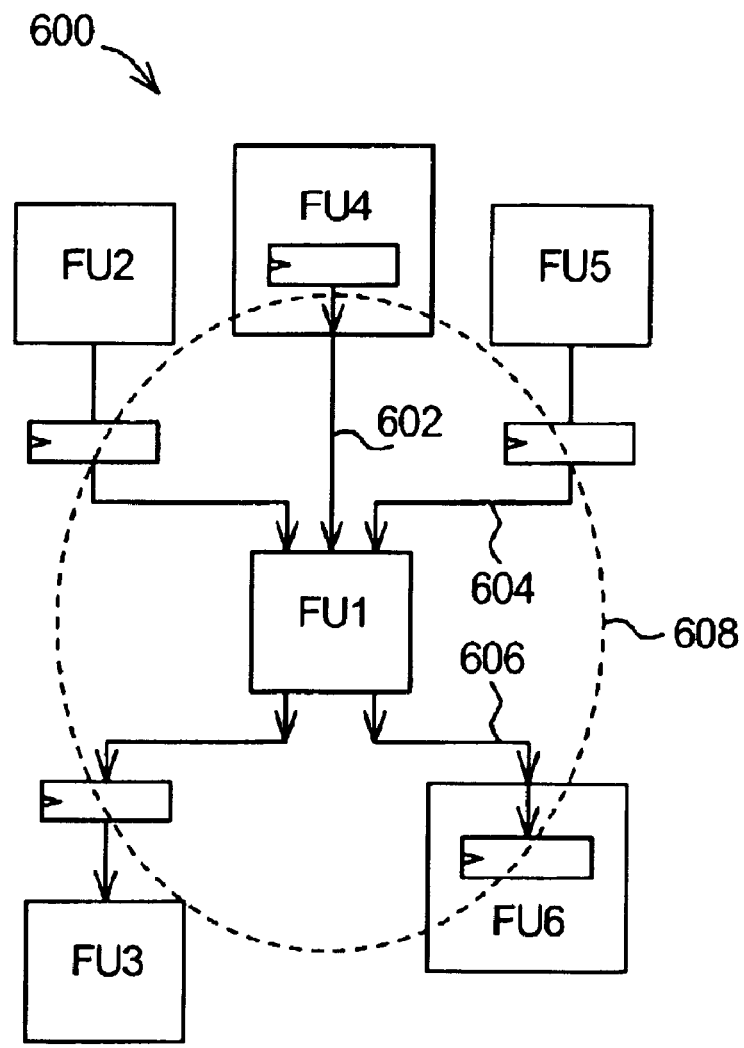
FIG. 6 illustrates an exemplary hardware structural representation in which incremental timing analysis may be performed in accordance with an aspect of the present invention.

FIG. 6 illustrates an exemplary hardware structural representation 600 in which incremental timing analysis may be performed. Virtual data flow links 602, 604 and 606 are newly added to the hardware structure as a result of a scheduling and binding operation on FU1, and the portion 608 of the updated hardware structure in which timing analysis is to be performed.

In one embodiment, conservative approximations may be made during the timing analysis in order to avoid a situation where the current scheduling and binding decision become timing-invalid in the future as more operations are bound on an FU (thereby causing its width, fan-out, load capacitance, or fan-in operand multiplexing to increase). Thus, the width, fan-out and fan-in of each FU is preferably approximated prior to scheduling and binding, based on the partition to which the FU belongs, the maximum fan-out over all operations in the program graph and the initiation interval (II).

If scheduling and binding step 112 fails to find a schedule that meets one or more given design objectives, then program flow may return to a prior step in the process 100 so that different design alternatives may be selected. In one instance, program flow may return to step 102 in which an alternate code transformation may be selected. For example, this could occur if the scheduler determines that the throughput requirements cannot be met for a certain loop, in which case, the recurrence cycle constraints that caused this situation may be fed back to step 102 as additional constraints to be satisfied in determining a better loop iteration schedule. In an alternative instance, program flow may return to step 110 in which alternate or additional FUs may be allocated. For example, if the scheduler fails to find a schedule altogether (e.g., due to resource constraints), or fails to find a schedule that passes the timing validity check (e.g., the clock cycle-time is not met or timing slack is insufficient), the set of operations which contributed to this failure may be fed back to step 110 where additional FUs corresponding to these operations may be allocated in order to relax the constraints on the scheduler in the next pass.

A method of considering circuit timing during the circuit design process is described in U.S. patent application Ser. No. 10/266,831, filed, Oct. 7, 2002, and entitled, "Method for Designing Minimal Cost, Timing Correct Hardware During Circuit Synthesis," the contents of which are hereby incorporated by reference. In summary, this document describes a method comprising receiving a clock cycle-time constraint, receiving delay characteristics of hardware resources from a macrocell library, receiving an operation, an alternative clock cycle associated with the operation and an alternative hardware resource associated with the operation, and determining validity of the received alternate with respect to timing constraints using a hardware structural representation of the program graph.

As described above, the timing analyzer 122 is used at various steps in the design flow 100 at different levels of abstraction. However, the underlying delay models and timing analysis algorithm are preferably common to and shared across all of them. The timing analyzer 122 receives queries during the design flow process 100. In response, the analyzer 122 returns timing latencies based on data contained in the macrocell library.

A method performing timing analysis of a proposed digital circuit is described in U.S. patent application Ser. No. 10/266,830, filed, Oct. 7, 2002, and entitled, "System for and Method of Clock-Cycle Time Analysis Using Mode-Slicing Mechanism," the contents of which are hereby incorporated by reference. In summary, this document describes a method comprising receiving timing models and the proposed digital circuit design, determining at least a mode of circuit operation, of the proposed digital circuit, deriving a subcircuit corresponding to each of at least one mode of circuit operation, performing timing analysis on each of the subcircuits derived corresponding to each of the modes, and combining the analysis results for all modes to determine an overall maximum circuit delay.

Each RT level hardware component (FUs, latches, switching multiplexors and logic elements) used in the method 100 preferably has a delay model associated with it, which may be included as part of the macrocell library 120. For example, a delay model includes a set a timing edges from input ports or internal pipelining latches of a hardware component to other internal pipelining latches or output ports, with associated delay functions ($\Delta_{in}$, $\Delta_{pipe}$, $\Delta_{out}$, $\Delta_{thru}$). The delays are a function of the relevant hardware parameters, e.g., FU width, output load capacitance, etc. The delay functions may be taken from the datasheet for a hard-macro, or they may be derived by performing logic synthesis for several combinations of the relevant parameters and subsequently measuring the delays. Further, the delays may be represented as closed-form functions, or as a set of values upon which interpolation may be performed as needed.

The timing analyzer 122 operates on a directed graph built using the delay models of a given set of hardware components and edges representing physical connectivity between their output and input ports. Unconnected input and output ports may be terminated by a latch. A process performed by the timing analyzer 122 determines maximum arrival times of signals at each node by recursively finding the maximum signal arrival time at all of its predecessor nodes, which may be implemented as a linear-time algorithm. In such determination, the timing analyzer 122 also incorporates the timing slack x to be set aside in order to account for the wire routing delay within a physical partition as determined in step 106.

Figure 7:
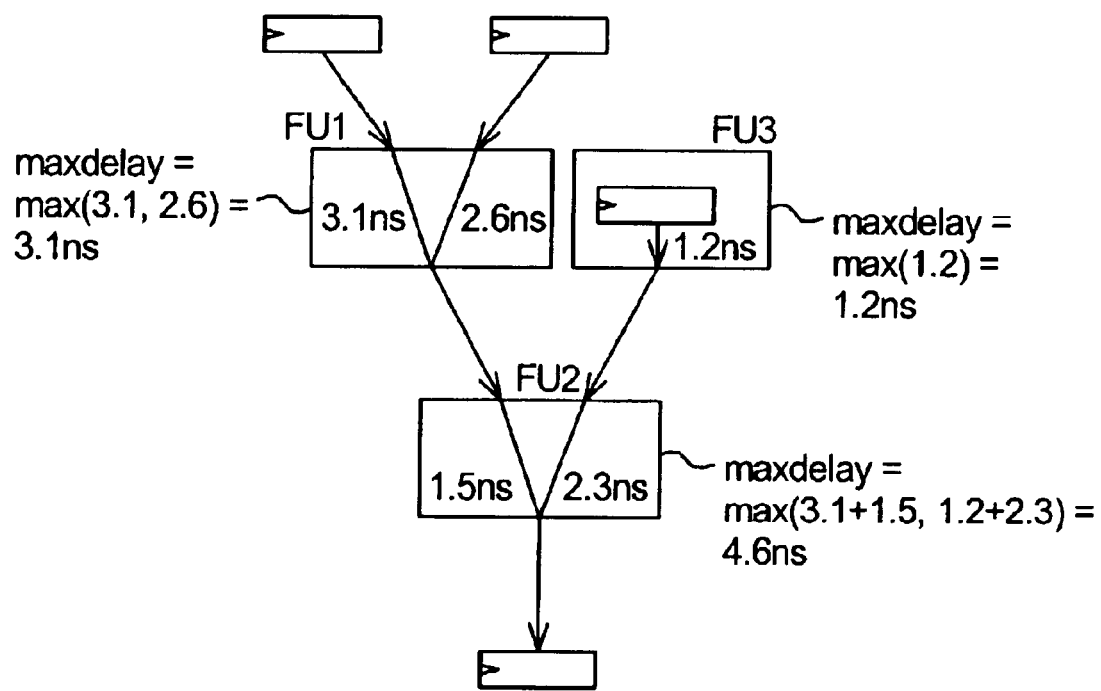
FIG. 7 illustrates an exemplary hardware structure for which timing may be analyzed in accordance with an aspect of the present invention.

FIG. 7 illustrates an exemplary hardware structure for which timing may be analyzed. As shown in FIG. 7, input and output ports are terminated by a latch and each timing edge is shown annotated with a delay value and the computation of the maximum signal arrival time (labeled, "maxdelay"). Note that interconnect delay is assumed to be zero for illustration purposes, though non-zero delays may be assigned to interconnects.

Figure 8A:
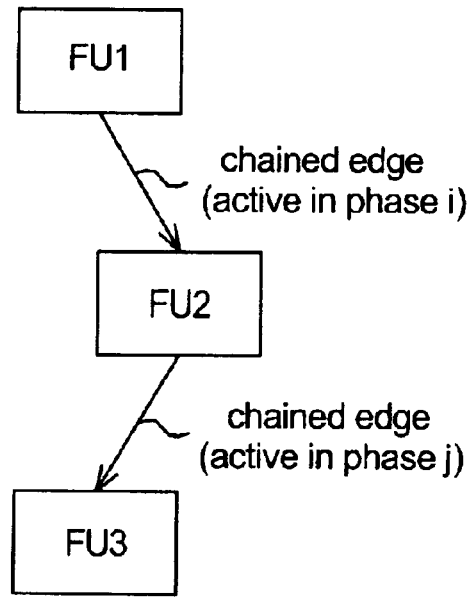
FIGS. 8A–B illustrate an exemplary false cyclic path and an exemplary false acyclic path, respectively, which are taken into account during timing analysis in accordance with an aspect of the present invention.
Figure 8B:
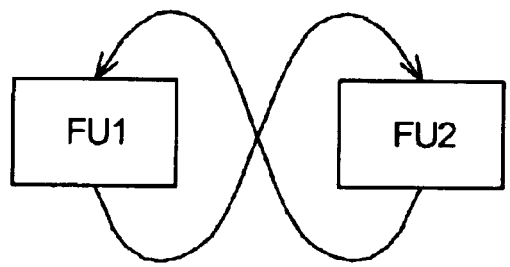

The timing analyzer 122 may also eliminate false paths and combinational cycles using the fact that the hardware has a periodicity related to the initiation interval (II). A path can be said to be false or unsensitizable when a signal cannot propagate from the beginning to the end of the path under any combination of actual inputs. For example, where three FUs are chained, but not all of FUs are active in the same phase, then a path through all three FUs is not sensitizable, referred to as an acyclic false path. This is shown by example in FIG. 8A. A false combinational cycle may arise where two different operator chains share FUs, but in different directions, referred to as a false cyclic path. This is shown by example in FIG. 8B. Both acyclic and cyclic false paths may be dealt with by performing the timing analysis separately for each of the II phases of circuit operation, where, for each phase, the timing analysis considers only those timing edges that are active in that phase.

The output from scheduling and binding step 112 may be in the form of a clustered array of processors containing functional units alone. From scheduling and binding step 112, program flow moves to a step 114, in which storage and interconnect materialization are performed. In this step, storage (e.g., shift registers or shift cells) elements are assigned to hold various values of variables so that the appropriate variables are available in accordance with the schedules developed in scheduling and binding step 112. In addition, interconnects between the storage elements and the functional units are generated for communicating the values of variables according to their locations in the storage elements at the times specified in the schedules and according to the functional units in which the variables are needed in accordance with the schedules.

The assignment of variables to storage elements attempts to minimize the cost of the storage elements so assigned by taking into account the width and the lifetime (time between the first production and the last consumption) of variables being produced from each functional unit. In one embodiment, different variables may share the same array of shift cells (and therefore use less overall storage) to the extent that their lifetimes do not overlap. However, when the widths of two variables being produced from the same functional unit is very different from each other and their lifetimes overlap, then it may be better to separate them into separate shift cell arrays with different widths in order to minimize overall storage cost. Similarly, the generation of the interconnect attempts to minimize the routing congestion by minimizing the number of long wires so generated. In one embodiment, a single multiplexor placed at the input of a functional unit that receives several variable values over long wires from different shift cells of the same array is split into two multiplexors, one placed closer to the shift cell array that selects among the various shift cells, and conveys the multiplexed value over a single long wire to a second multiplexor placed closer to the functional unit. In materializing the storage and the interconnect as described above, timing validity of the generated storage and the interconnect is also checked by using the timing analyzer 122 and the materialization is modified in order to obtain a valid hardware circuit. Furthermore, physical partitioning constraints, if any, specified at step 106 are also honored with respect to the materialization of the inter-partition interconnect.

A technique for performing storage and interconnect materialization is described in U.S. patent application Ser. No. 09/816,851, filed, Mar. 23, 2001, and entitled, "Storage System for Use in Custom Loop Accelerators And the Like," the contents of which are hereby incorporated by reference. In a preferred embodiment, the output of the storage interconnect materialization step 114 is a hardware description given in the Architectural Intermediate Representation (AIR).

After scheduling and binding operations, binding of variables to registers and subsequent materializations of the hardware has been performed, timing analysis may be performed on the detailed RTL hardware structure (e.g., by timing analyzer 122). At this point, the FU widths, fan-outs and fan-ins have been determined in detail (if not exactly) and, thus, the results of this timing analysis can be very accurate. Accordingly, this timing analysis serves as a validation of the design for timing correctness.

In step 116, a hardware specification for the circuit is generated in standard hardware description languages such as VHDL or Verilog based on the prior steps. For example, the AIR representation from step 114 may be converted to Register Transfer Level (RTL) in step 116. The hardware specification is then ready for physical synthesis.

The result of step 116 is a representation of a register-level view of the hardware circuit and has the functionality of the functional specification for the circuit. By virtue of this invention, the hardware circuit would be likely to have one-pass timing convergence and routability (besides meeting additional design objectives such as cost and performance) during subsequent physical synthesis. After physical synthesis, the result for an FPGA-target could be a bit file that is downloaded into the FPGA fabric. For a standard-cell technology, the result would be a set of masks that are ready for fabrication into silicon.

When implemented in software, the elements of the present invention are essentially the code segments to perform the necessary tasks. The program or code segments can be stored in a processor readable medium or transmitted by a computer data signal embodied in a carrier wave, or a signal modulated by a carrier, over a transmission medium. The "processor readable medium" may include any medium that can store or transfer information. Examples of the processor readable medium include an electronic circuit, a semiconductor memory device, a ROM, a flash memory, an erasable ROM (EROM), a floppy diskette, a compact disk CD-ROM, an optical disk, a hard disk, a fiber optic medium, a radio frequency (RF) link, etc. The computer data signal may include any signal that can propagate over a transmission medium such as electronic network channels, optical fibers, air, electromagnetic, RF links, etc. The code segments may be downloaded via computer networks such as the Internet, Intranet, etc.

Figure 9:
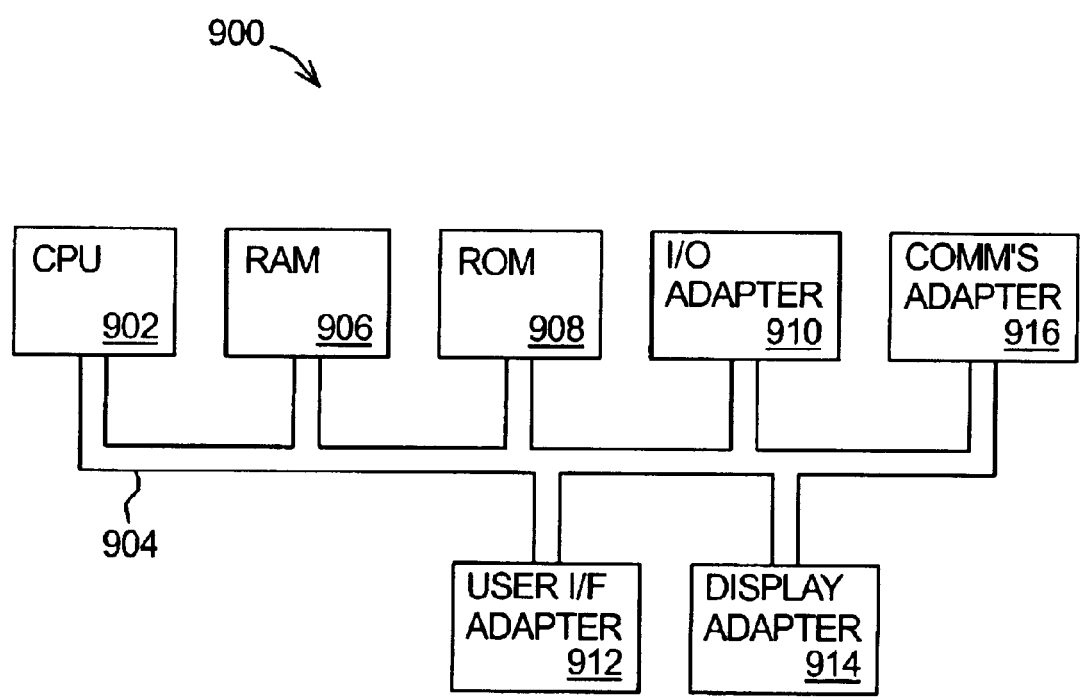
FIG. 9 illustrates a block diagram of a computer system which is adapted to implement the present invention.

FIG. 9 illustrates computer system 900 adapted to use the present invention. Central processing unit (CPU) 902 is coupled to system bus 804. The CPU 902 may be any general purpose CPU. However, the present invention is not restricted by the architecture of CPU 902 as long as CPU 902 supports the inventive operations as described herein. Bus 904 is coupled to memory, such as random access memory (RAM) 906, which may be SRAM, DRAM, or SDRAM, and ROM 908, which may be PROM, EPROM, or EEPROM. RAM 906 and ROM 908 hold user and system data and programs as is well known.

Bus 904 may also be coupled to input/output (I/O) adapter 910, user interface adapter 912, display adapter 914 and communications adapter 916. The I/O adapter 910 may connect one or more storage devices (not shown), such as one or more of a hard drive, a CD drive, a floppy disk drive, a tape drive, to the computer system 900. The I/O adapter 910 may also be connected to printer (not shown). User interface adapter 912 may couple user input/input devices (not shown), such as keyboard, pointing device, microphone and/or speaker, to the computer system 900. The display adapter 914 may be driven by CPU 902 to control a display device (not shown). Communications adapter 916 may couple the computer system 900 to a network (not shown), which may be one or more of a telephone network, a local (LAN) and/or a wide-area (WAN) network, an Ethernet network, and/or the Internet network.

While the foregoing has been with reference to particular embodiments of the invention, it will be appreciated by those skilled in the art that changes in these embodiments may be made without departing from the principles and spirit of the invention, the scope of which is defined by the appended claims.

What is claimed is:

1. A programmatic method for generating a circuit design from a functional specification according to at least one design objective, comprising steps of:
    forming an intermediate representation of the functional specification including performing code transformations and optimizations for meeting the at least one design objective including a loop nest throughput objective;
    analyzing the intermediate representation for identifying a physical instantiation predicted to result in unacceptable interconnect delay or congestion;
    allocating functional units for performing operations of the intermediate representation, said allocating comprising selecting functional units from a plurality of candidate functional units;
    scheduling and binding operations to occur at specified cycle-times on said selected functional units; and
    forming an architectural representation of the circuit design according to results of said scheduling and binding.

2. The method according to claim 1, wherein the at least one design objective comprises at least one of meeting a clock cycle-time, routability of interconnects, cost minimization, meeting a throughput, latency minimization, and power consumption minimization.

3. The method according to claim 1, wherein said forming the intermediate representation comprises transforming the functional specification to execute on an array of virtual processors having nearest neighbor communications for a design objective of routability of interconnects.

4. The method according to claim 1, wherein said forming the intermediate representation comprises introducing recurrences for a design objective of cost minimization.

5. The method according to claim 1, wherein said forming the intermediate representation comprises determining validity of candidate loop iteration schedules.

6. The method according to claim 5, wherein validity of candidate loop iteration schedules is according to a timing constraint based on a clock period.

7. The method according to claim 1, wherein said analyzing uses an abstract empirical model of a given physical synthesis design flow that expresses conditions under which the physical synthesis is expected to meet the at least one design objective.

8. The method according to claim 1, wherein in response to said analyzing, compensation is inserted into the intermediate representation.

9. The method according to claim 8, wherein said allocating functional units is performed in accordance with said compensation.

10. The method according to claim 1, further comprising partitioning operations of the intermediate code into a plurality of disjoint sets.

11. The method according to claim 10, wherein a design objective for said partitioning comprises routability of interconnects.

12. The method according to claim 10, wherein a design objective for said partitioning comprises cost minimization.

13. The method according to claim 10, wherein said partitioning is based on a selected timing slack.

14. The method according to claim 10, wherein said partitioning is based on a selected partition size.

15. The method according to claim 14, further comprising determining a timing slack based on said partitioning and using said timing slack as input to at least one of said steps of allocating and scheduling.

16. The method according to claim 1, wherein a design objective for said allocating comprises at least one timing constraint.

17. The method according to claim 16, wherein the at least one timing constraint comprises a desired clock period for the functional unit.

18. The method according to claim 1, wherein a design objective for said allocating comprises cost minimization.

19. The method according to claim 1, wherein a design objective for said allocating comprises power consumption minimization.

20. The method according to claim 1, further comprising re-allocating functional units when said scheduling fails to meet at least one of the design objectives.

21. The method according to claim 20, wherein said re-allocating is performed in response to said scheduling failing to find a schedule having sufficient slack to meet a specified clock cycle-time.

22. The method according to claim 20, wherein said re-allocating is performed in response to said scheduling failing to find a valid schedule.

23. The method according to claim 1, further comprising re-forming an intermediate representation when said scheduling fails to meet at least one of the design objectives.

24. The method according to claim 23, wherein said re-forming is performed in response to said scheduling failing to find a valid schedule and the method further comprising analyzing said re-formed intermediate representation and re-allocating functional units based on a re-formed intermediate representation.

25. The method according to claim 1, wherein a design objective for said scheduling is meeting a clock cycle-time.

26. The method according to claim 1, wherein said functional specification comprises a sequential loop nest and further wherein said forming the intermediate representation comprises transforming the sequential loop nest into parallel processes and each of the parallel processes corresponds to a set of iterations of a loop body and further comprising assigning iterations to an array of virtual processors.

27. The method according to claim 26, further comprising performing heterogenization on said array of virtual processors for cost minimization.

28. The method according to claim 26, further comprising performing heterogenization on said array of virtual processors for meeting a clock cycle-time.

29. The method according to claim 26, further comprising performing heterogenization on said array of virtual processors for routability of interconnects.

30. The method according to claim 1, further comprising performing op-chain candidate identification comprising identifying potential operator chains for performing operations of the intermediate representation and selecting from among the potential operator chains according to whether a timing constraint is satisfied.

31. The method according to claim 1, wherein forming an architectural representation comprises materializing a storage and interconnect for the circuit design including interconnects for communicating values of variables among storage elements in accordance with said scheduling.

32. The method according to claim 31, wherein said materializing a storage and interconnect for the circuit design comprises sharing storage elements among the variables.

33. The method according to claim 31, wherein said materializing a storage and interconnect for the circuit design comprises minimizing wire lengths for a design objective of routability of interconnects.

34. The method according to claim 31, wherein a design objective for said materializing a storage and interconnect for the circuit design comprises meeting a clock cycle-time.

35. The method according to claim 1, wherein the intermediate representation is a program graph having nodes corresponding to operations of the functional specification and edges corresponding to dependencies among the operations.

36. The method according to claim 1, wherein said loop nest throughput objective comprises initiation interval and clock cycle-time objectives.

37. The method according to claim 36, wherein said allocating functional units is performed to satisfy the clock cycle-time objective and for minimizing one or more of cost and power consumption.

38. The method according to claim 37, wherein said scheduling and binding comprises determining timing validity for the operations performed at the specified cycle-times on the selected functional units.

39. An apparatus for generating a circuit design from a functional specification, comprising computer hardware programmed according to a sequence of executable instructions for performing steps of: forming an intermediate representation from the functional specification including performing code transformations and optimizations for meeting at least one design objective including a loop nest throughput objective, analyzing the intermediate representation for identifying a physical instantiation predicted to result in unacceptable interconnect delay or congestion, allocating functional units for performing operations of the intermediate representation, scheduling and binding operations to occur at specified cycle-times on said selected functional units, and forming an architectural representation of the circuit design according to results of said scheduling and binding.

40. The apparatus according to claim 39, further comprising a timing analyzer for determining timing validity in response to queries generated during performance of said sequence of executable instructions.

41. The apparatus according to claim 40, wherein said timing analyzer determines validity of results of said scheduling.

42. The apparatus according to claim 41, wherein said timing analyzer is coupled to a macrocell library, said macrocell library having timing data for each of a plurality of the functional units, said timing data used by said timing analyzer for determining timing validity in response to said queries.

43. The apparatus according to claim 39, further comprising a spatial analyzer for providing spatial analysis results in response to a query received by the spatial analyzer during said analyzing the intermediate representation.

44. The apparatus according to claim 43, wherein the spatial analyzer comprises an abstract empirical model of a given physical synthesis design flow that expresses conditions under which the physical synthesis is expected to meet design objectives.

45. The method according to claim 39, wherein forming an architectural representation comprises materializing a storage and interconnect for the circuit design including interconnects for communicating values of variables among storage elements in accordance with said scheduling.

46. The apparatus according to claim 39, wherein said loop nest throughput objective comprises initiation interval and clock cycle-time objectives.

47. The apparatus according to claim 46, wherein said allocating functional units is performed to satisfy a specified clock cycle-time and for minimizing one or more of cost and power consumption.

48. The apparatus according to claim 47, wherein said scheduling and binding comprises determining timing validity for the operations performed at the specified cycle-times on the selected functional units.

49. A programmatic method for generating a circuit design from a functional specification according to at least one design objective, comprising steps of:
    forming an intermediate representation of the functional specification;
    analyzing the intermediate representation for identifying a physical instantiation predicted to result in unacceptable interconnect delay or congestion, said analyzing using an abstract empirical model of a given physical synthesis design flow that expresses conditions under which the physical synthesis is expected to meet the at least one design objective;
    allocating functional units for performing operations of the intermediate representation, said allocating comprising selecting functional units from a plurality of candidate functional units;
    scheduling and binding operations to occur at specified cycle-times on said selected functional units; and
    forming an architectural representation of the circuit design according to results of said scheduling.

50. The method according to claim 49, wherein the at least one design objective comprises at least one of meeting a clock cycle-time, routability of interconnects, cost minimization, meeting a throughput, latency minimization, and power consumption minimization.

51. A programmatic method for generating a circuit design from a functional specification according to at least one design objective, comprising steps of:
    forming an intermediate representation of the functional specification;
    analyzing the intermediate representation for identifying a physical instantiation predicted to result in unacceptable interconnect delay or congestion;
    performing op-chain candidate identification comprising identifying potential operator chains for performing operations of the intermediate representation and selecting from among the potential operator chains according to whether a timing constraint is satisfied;
    allocating functional units for performing operations of the intermediate representation, said allocating comprising selecting functional units from a plurality of candidate functional units;
    scheduling and binding operations to occur at specified cycle-times on said selected functional units; and
    forming an architectural representation of the circuit design according to results of said scheduling.

52. The method according to claim 51, wherein the at least one design objective comprises the timing constraint and at least one of routability of interconnects, cost minimization, meeting a throughput, latency minimization, and power consumption minimization.

53. A programmatic method for generating a circuit design from a functional specification according to at least one design objective, comprising steps of:
- forming an intermediate representation of the functional specification including transforming the functional specification to execute on an array of virtual processors;
- performing heterogenization on said array of virtual processors;
- analyzing the intermediate representation for identifying a physical instantiation predicted to result in unacceptable interconnect delay or congestion;
- allocating functional units for performing operations of the intermediate representation, said allocating comprising selecting functional units from a plurality of candidate functional units;
- scheduling and binding operations to occur at specified cycle-times on said selected functional units; and
- forming an architectural representation of the circuit design according to results of said scheduling.

54. The method according to claim 53, said heterogenization being performed for cost minimization.

55. The method according to claim 53, said heterogenization being performed for meeting a clock cycle-time.

56. The method according to claim 53, said heterogenization being performed for routability of interconnects.

* * * * *